United States Patent [19]
Lundqvist et al.

[11] Patent Number: 5,697,089
[45] Date of Patent: Dec. 9, 1997

[54] LOCAL OSCILLATOR HAVING PLURAL OSCILLATORS FACILITATING CHANNEL SWITCHING

[75] Inventors: Björn Lundqvist; Björn Lofter, both of Mölndal, Sweden

[73] Assignee: Telefonaktiebolaget LM Ericsson, Stockholm, Sweden

[21] Appl. No.: 359,734

[22] Filed: Dec. 20, 1994

[30] Foreign Application Priority Data

Dec. 21, 1993 [SE] Sweden ................... 9304225

[51] Int. Cl.$^6$ ................... H04B 1/26; H04B 15/00
[52] U.S. Cl. ................... 455/315; 455/314; 455/197.1; 455/183
[58] Field of Search ................... 455/314, 315, 455/316, 207, 209, 260, 197.1, 189.1, 190.1, 183.1, 265, 183, 263, 33.1, 102

[56] References Cited

U.S. PATENT DOCUMENTS

| | | | |
|---|---|---|---|
| 4,092,594 | 5/1978 | Baker ................... | 325/21 |
| 4,225,974 | 9/1980 | Miyamoto . | |
| 4,491,976 | 1/1985 | Saitoh et al. . | |
| 5,220,680 | 6/1993 | Lee ................... | 455/102 |

FOREIGN PATENT DOCUMENTS

| | | |
|---|---|---|
| 60-259003 | 12/1985 | Japan . |
| 2067865 | 1/1981 | United Kingdom . |
| 2171570 | 8/1986 | United Kingdom . |

*Primary Examiner*—Reinhard J. Eisenzopf
*Assistant Examiner*—Darnell R. Armstrong
*Attorney, Agent, or Firm*—Burns, Doane, Swecker & Mathis, L.L.P.

[57] ABSTRACT

A device for generating a first signal and a second signal in a receiver for reception of a number of radio frequency signals. The first signal is mixed in a first mixer with the received radio frequency signals in order to generate an intermediate frequency signal which is subsequently mixed with the second signal in a second mixer. A first oscillator generates a signal which, after frequency multiplication in a frequency multiplier, is the first signal, the frequency of which can be changed in a number of frequency steps. A second oscillator generates the second signal, the frequency of which also can be changed in a number of frequency steps. The magnitude of the frequency steps by which the first signal can be changed is a multiple of the frequency steps by which the second signal can be changed.

4 Claims, 1 Drawing Sheet

LOCAL OSCILLATOR HAVING PLURAL OSCILLATORS FACILITATING CHANNEL SWITCHING

BACKGROUND

The present invention relates to a device for generating oscillator frequencies.

Radio communication equipment extensively use receivers of the double superheterodyne type. This means that the received, high frequency signal is mixed in two steps with local oscillator signals generatedby the receiver with frequencies that are selected in such a way that the frequencies of the mixing products (intermediate frequencies) become lower than those of the received signal, whereby it becomes easier to amplify and in other ways treat the signal.

For certain applications, for example radio links, the receivers are constructed for reception on a number of fixed frequencies (radio channels). The radio channels differ in frequency by a certain, defined value (or a multiple of this value). Switching between reception of these channels is done by changing the frequency of the local oscillator signal to the first mixer such that the intermediate frequency remains the same. Due to this, the locally generated signal to the second mixer does not have to be changed.

The locally generated signals are often generated with the help of voltage-controlled oscillators that are phase-locked to a reference oscillator. With current state of the art such a local oscillator device can be constructed for frequencis up to the magnitude of 2 GHz. If higher frequencies are desired, for example 10 Ghz, a fixed multiplier has to be attached to the output of the local oscillator.

A fixed multiplier on the other hand means that every frequency change that is executed in the local oscillator will be multiplied by a certain factor. For predetermined channel distances, this implies that the frequency of the local oscillator has to have the capability to be adjusted in smaller steps compared to the case without a fixed multiplier. This in turn implies that the time for locking the local oscillator at frequency transfer between different channels will increase proportionately. Channel distances and locking time are inversely proportional to each other.

Local oscillators for receivers of the double super heterodyne type are naturally previously known. The U.S. Pat. No. 4,491,976 is an example of such a device. The patent however does not describe any measures for reducing the locking time of the local oscillator, but only treats temperature-stabilization of the oscillator.

The British patent application GB 2 171 570 also describes a local oscillator device for a double super heterodyne receiver. For the generation of local oscillator signals to the two mixers, there are two oscillators that are phase locked to a common reference oscillator. By inclusion of frequency dividers, in the respective oscillator loop, whose division number can be varied, the oscillator frequencies of the two oscillators can be controlled. This control possibility is used in the described device by different combinations of local oscillator frequencies to avoid unwanted mixing products that can cause interference. The patent application however does not touch upon the problem concerning the locking time when quickly switching between near frequencies.

In the British patent application GB 2 067 865 a local oscillator device is also described. The device is intended for a double super heterodyne receiver for frequencies up to the magnitude of 30 MHz. The purpose of the device seems to be to replace earlier capacitive-tuned oscillators with more modern digitally controlled equipment. The British application does however not mention the problems that arise when local oscillator frequencies in the microwave band are to be generated, nor the difficulties that the demands on short locking times mean when switching between different frequency channels.

SUMMARY

The object of the present invention is thus to provide a local oscillator device for a double super heterodyne receiver that gives short locking times when changing frequencies in connection with switching reception between different radio channels even when the frequency distance between the channels is small.

Said object is achieved by means of a device according to the present invention, the characterizing features of which will become apparent from the following description.

In accordance with the invention, there is provided in a receiver which, when receiving signals with frequencies in the microwave range or higher, is intended to quickly be able to switch between different received frequencies, and in which a first signal and a second signal are generated and the first signal is mixed with the received signals in a first mixer to generate an intermediate frequency signal that is mixed with the second signal in a second mixer, a device for generating the first and second signals. The device comprises a first oscillator for generating a signal that, after frequency multiplication in a frequency multiplier, is the first signal whose frequency can be changed in a number of frequency steps; and a second oscillator for generating the second signal whose frequency can be changed in a number of steps. The different frequencies that the receiver is adapted to receive are prefixed channels; the frequency distance between the channels is at least one of a fixed value and a multiple of the fixed value; the steps correspond to the fixed value between the channels; and switching between channels takes place by a combination of alteration of the first and the second oscillator frequencies, whereby when the frequency of the first oscillator is changed, the frequency change is a multiple of the frequency steps by which the second signal can be changed.

DETAILED DESCRIPTION

The invention shall be described in the following in the form of an example of an embodiment. However, to facilitate the understanding of the function according to the invention, by way of introduction, a local oscillator device according to the prior art shall be described with reference to FIG. 1.

Figure 1:
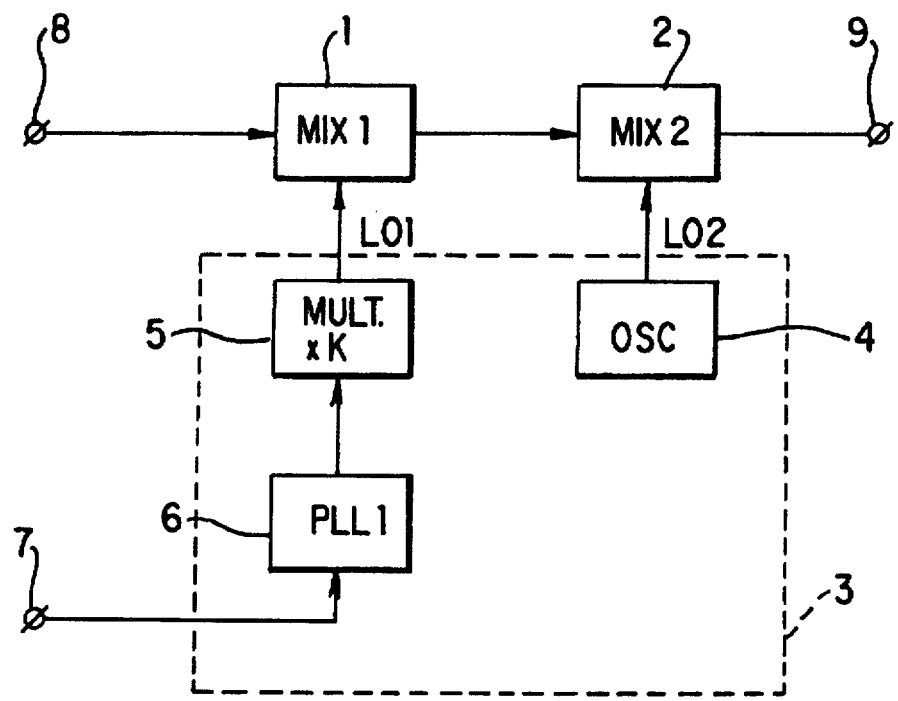
FIG. 1 shows a local oscillator arrangement according to the prior art

FIG. 1 shows two mixers 1 (MIX 1) and 2 (MIX 2) connected in series in a double super heterodyne receiver. Filter and amplification devices (not shown) can be placed between the mixers. The bandwidth of these devices are adapted to the frequency distance between the radio channels for which the receiver is intended. A device 3 for the generation of local oscillator signals to the mixers comprises a first oscillator 6 (PLL), a frequency multiplier 5 (MULT) and a second oscillator 4 (OSC) with a fixed frequency. The frequency of the first oscillator 6 can be adjusted with the help of a control signal from a frequency control unit (not shown) connected to the control input 7.

A received high frequency signal is connected to the signal input 8 and is mixed in the first mixer 1 with a first local oscillator signal LO1. LO1 consists of the ouput signal from the oscillator 6 after this signal has been frequency multiplied k times in the multiplier 5. The reason for the frequency multiplication can be that the required frequency of the local oscillator signal is so high that it is not possible to directly generate it with a phase-locked voltage-controlled oscillator.

The output signal from the first mixer 1, which constitutes an intermediate frequency signal whose frequency is normally lower than that of the received signal, is after a possible filtration and amplification fed to the second mixer 2. In this mixer, the intermediate frequency signal is mixed with a second local oscillator signal LO2 that is composed of the output signal from the second oscillator 4. The output signal from the second mixer is connected to the output 9.

The first oscillator 6 comprises a reference oscillator and a voltage-controlled oscillator whose frequency of the output signal after a frequency division is compared to the frequency of the reference oscillator. The frequency of the reference oscillator can also be frequency divided before the comparison. The result of the comparison—frequency difference—is allowed to make up an error signal that controls the frequency of the voltage-controlled oscillator. The loop that is thereby formed will phase-lock the divided frequency of the voltage-controlled oscillator to the (divided) frequency of the reference oscillator. By changing the number by which the frequency division is executed, the frequency of the voltage-controlled oscillator consequently can be changed. The output signal of the voltage-controlled oscillator also constitutes the output signal from the fiEst oscillator 6.

As the described device is utilized in a receiver where reception is to take place on a number of predetermined and known channels with near frequencies, the following is valid:

If the frequency distance between two near channels is $\Delta f$ (or multiples of $\Delta f$) the "channel distance" of the first oscillator 6 has to be $\Delta f/k$. A rule of thumb that is used during the contruction of phase-locked loops is that their loop bandwidth (BW) has to be less than a tenth of the channel distance. If this rule is not followed, the chances for spurious oscillations and that the oscillator locks in on the wrong channel increase. This gives the relationship $$BW < (\Delta f/k)/10$$

For the relationship between the transient time t of the loop and the loop bandwidth BW there exists another rule of thumb that is $$t = 3/BW$$

If these expressions are combined the result becomes $$t > 30*k/\Delta f$$

which means that for a given channel distance there is a shortest locking time, and with small channel distances the transient times become very large.

In many applications, for example radio links where switching between different channels has to be carried out quickly or in radar stations where frequency changes between every transmitted pulse, these long locking times cannot be accepted.

Figure 2:
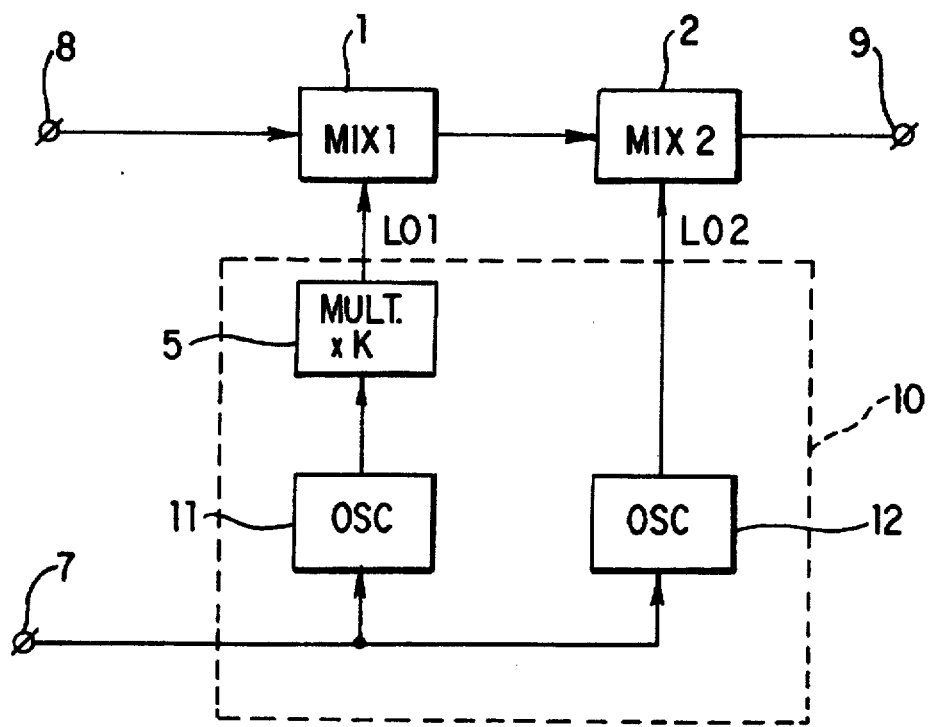
FIG. 2 shows an embodiment of a local oscillator device according to the invention.

FIG. 2 shows an embodiment of the invention. Those parts comprised in this device whose functions correspond to those described in connection with FIG. 1 have been given the same reference number as those in FIG. 1. According to the invention, the local oscillator 10 comprises two oscillators 11 (PLL 3) and 12 (PLL 2), both which are of the same design as the earlier described oscillator 6, i.e. a voltage-controlled oscillator that is phase-locked to a reference oscillator and whose frequency can be adjusted by changing the number by which the frequency is divided before the phase lock. The frequency of the oscillators 11 and 12 can be controlled individually with the control signal connected to the control input 7. Incorporated in the local oscillator 10, as in the earlier described device 3, is a multiplier 5 which multiplies the frequency of the oscillator 11 by the number k.

According to the invention, the frequency of the oscillator 11 (LO1) as well as the frequency of the oscillator 12 (LO2) are changed at channel switching. LO1 is changed in relatively large steps while LO2 is changed in small steps, whereby the bandwidth needs to be increased for the filter and amplification devices placed in between the mixers. The possible frequency change for the oscillator 12 is presumed to correspond to the frequency difference for n channels. The channel distance is presumed to be, as before, $\Delta f$ which means that the frequency for the oscillator 12 and LO2 can be changed in steps corresponding to $\Delta f$. This means that LO1 only needs to be changed in steps of $n*\Delta f$ since the "fine adjustment" is done with the oscillator 12 and LO2. The corresponding frequency change for the oscillator 11 then becomes $n*\Delta f/k$.

If the loop bandwidth for the oscillators 11 and 12 are assumed to be equal to BW then the transient time t' for the oscillator 12, in analogy with the derivation of the last expression, becomes $$t' > 30/\Delta f$$

and the transient time t" for the oscillator 11

$$t'' > 30*k/(n*\Delta f)$$

The frequency error for the whole receiver is the sum of the errors for LO1 and LO2. As the frequency of LO1 is much higher than that of LO2, the error in frequency of LO1 is the dominating one. The error contribution from LO2 can therefore be disregarded. This means that for the local oscillator device according to the invention the relationship between transient time and channel distance is determined by the last expression. If this expression is compared with the third expression, one can conclude that due to the invention the shortest possible transient time with a given channel distance has been reduced by a factor n.

The invention is not limited to the described embodiments, but may be varied freely within the scope of the appended claims.

What is claimed is:

1. In a receiver which, when receiving signals with frequencies in the microwave range or higher, is intended to quickly be able to switch between different received frequencies, and in which a first signal and a second signal are generated and the first signal is mixed with the received signals in a first mixer to generate an intermediate frequency signal that is mixed with the second signal in a second mixer, a device for generating the first and second signals, comprising:
- a first oscillator for generating a third signal whose frequency is changed in a number of frequency steps wherein, said third signal is frequency multiplied in a frequency multiplier to generate the first signal; and
- a second oscillator for generating the second signal whose frequency is changed in a number of steps;
- wherein the different frequencies that the receiver is adapted to receive are prefixed channels; the frequency distance between the channels is at least one of a fixed value and a multiple of the fixed value; the steps correspond to the fixed value between the channels; and switching between channels takes place by a combination of alteration of the first and second oscillator frequencies, whereby when the frequency of the first oscillator is changed, the frequency change is a multiple of the frequency steps by which the second signal can be changed.

2. The device of claim 1, wherein a time needed for changing reception between different channels is substantially determined by a transient time of the first oscillator.

3. The device of claim 1, wherein at least one of the first oscillator and the second oscillator comprises a voltage-controlled oscillator whose frequency is phase-locked to a frequency of a reference oscillator.

4. The device of claim 1, wherein the frequency of the received signals is higher than the frequency of the intermediate frequency signal.

* * * * *